United States Patent
Tiedemann, Jr. et al.

(10) Patent No.: US 6,954,504 B2
(45) Date of Patent: Oct. 11, 2005

(54) METHOD AND SYSTEM FOR CODE COMBINING IN A COMMUNICATION SYSTEM

(75) Inventors: Edward G. Tiedemann, Jr., Concord, MA (US); Yongbin Wei, San Diego, CA (US); Aziz Gholmieh, San Diego, CA (US); Tao Chen, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 0 days.

(21) Appl. No.: 10/456,217

(22) Filed: Jun. 6, 2003

(65) Prior Publication Data

US 2004/0081249 A1 Apr. 29, 2004

Related U.S. Application Data

(60) Provisional application No. 60/421,186, filed on Oct. 25, 2002.

(51) Int. Cl.[7] ............................................. H04L 27/00
(52) U.S. Cl. ..................................... 375/259; 375/260
(58) Field of Search ............................... 375/130, 140, 375/141, 146, 147, 259, 260, 295, 316; 370/206, 320, 347

(56) References Cited

U.S. PATENT DOCUMENTS

| 4,901,307 | A | | 2/1990 | Gilhousen et al. ........... 370/320 |
|---|---|---|---|---|
| 5,103,459 | A | | 4/1992 | Gilhousen et al. .......... 370/206 |
| 5,504,773 | A | | 4/1996 | Padovani et al. ........... 375/130 |
| 5,963,548 | A | * | 10/1999 | Virtanen ..................... 370/335 |
| 5,978,365 | A | * | 11/1999 | Yi ............................... 370/331 |
| 6,072,361 | A | * | 6/2000 | Myers et al. ................. 330/10 |
| 6,356,528 | B1 | * | 3/2002 | Lundby et al. ............. 370/209 |
| 6,574,211 | B2 | | 6/2003 | Padovani et al. ........... 370/347 |

FOREIGN PATENT DOCUMENTS

EP  1139689  4/2001

* cited by examiner

*Primary Examiner*—Chieh M. Fan
(74) *Attorney, Agent, or Firm*—Philip R. Wadsworth; Thien T. Nguyen; S. Hossain Beladi

(57) ABSTRACT

An encoder encodes a block of information to be transmitted, to improve protection by adding redundancy. The redundancy permits decoding of the information from less than a complete encoded block of information. The use of a combiner with a decoder enables better decoding of symbols.

12 Claims, 5 Drawing Sheets

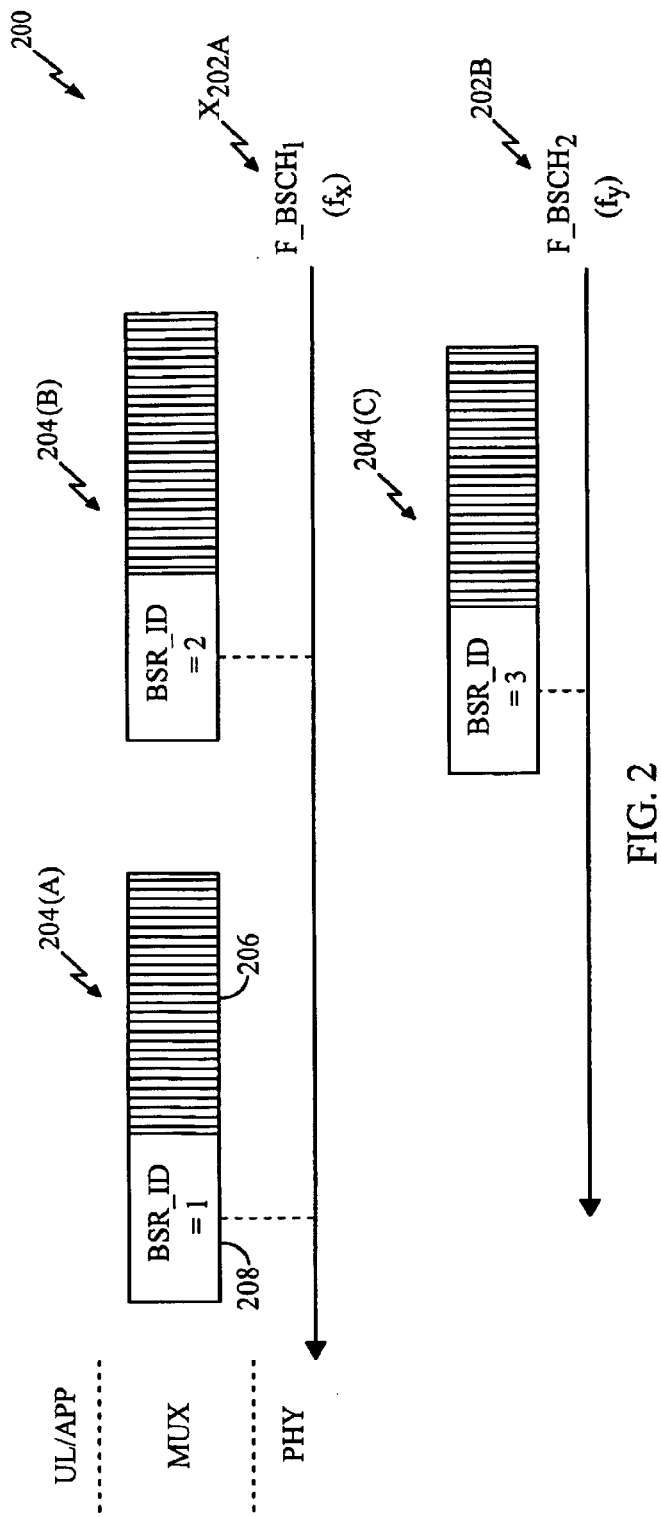
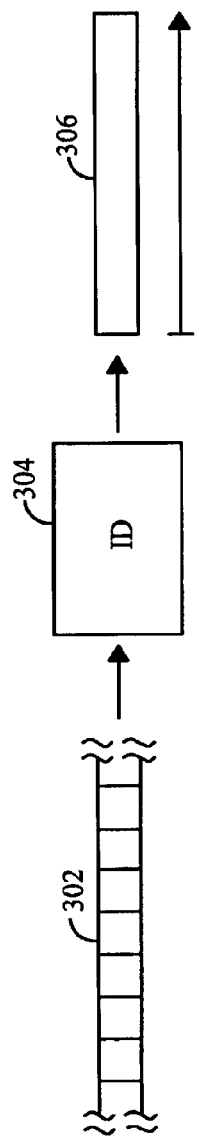
FIG. 2
FIG. 3

METHOD AND SYSTEM FOR CODE COMBINING IN A COMMUNICATION SYSTEM

This application is a non-provisional application claiming priority to provisional application Ser. No. 60/421,186, filed on Oct. 25, 2002, entitled "Method and System For Code Combining in a Communication System".

BACKGROUND

1. Field

The present invention relates to broadcast or multicast communications, otherwise known as point-to-multipoint communications, in a wireline or a wireless communication system. More particularly, the present invention relates to a system and method for code combining data from different base stations in a broadcast or multicast communication system.

2. Background

Communication systems have been developed to allow transmission of information signals from an origination station to a physically distinct destination station. In transmitting information signal from the origination station over a communication channel, the information signal is first converted into a form suitable for efficient transmission over the communication channel. Conversion, or modulation, of the information signal involves varying a parameter of a carrier wave in accordance with the information signal in such a way that the spectrum of the resulting modulated carrier is confined within the communication channel bandwidth. At the destination station the original information signal is replicated from the modulated carrier wave received over the communication channel. Such a replication is generally achieved by using an inverse of the modulation process employed by the origination station.

Modulation also facilitates multiple-access, i.e., simultaneous transmission and/or reception, of several signals over a common communication channel. Multiple-access communication systems often include a plurality of subscriber stations requiring intermittent service of relatively short duration rather than continuous access to the common communication channel. Several multiple-access techniques are known in the art, such as time division multiple-access (TDMA), frequency division multiple-access (FDMA), and amplitude modulation multiple-access (AM). Another type of a multiple-access technique is a code division multiple-access (CDMA) spread spectrum system that conforms to the "TIA/EIA/IS-95 Mobile Station-Base Station Compatibility Standard for Dual-Mode Wide-Band Spread Spectrum Cellular System," hereinafter referred to as the IS-95 standard. The use of CDMA techniques in a multiple-access communication system is disclosed in U.S. Pat. No. 4,901,307, entitled "SPREAD SPECTRUM MULTIPLE-ACCESS COMMUNICATION SYSTEM USING SATELLITE OR TERRESTRIAL REPEATERS," and U.S. Pat. No. 5,103,459, entitled "SYSTEM AND METHOD FOR GENERATING WAVEFORMS IN A CDMA CELLULAR TELEPHONE SYSTEM," both assigned to the assignee of the present invention.

A multiple-access communication system may be a wireless or wireline and may carry voice and/or data. An example of a communication system carrying both voice and data is a system in accordance with the IS-95 standard, which specifies transmitting voice and data over the communication channel. A method for transmitting data in code channel frames of fixed size is described in detail in U.S. Pat. No. 5,504,773, entitled "METHOD AND APPARATUS FOR THE FORMATTING OF DATA FOR TRANSMISSION", assigned to the assignee of the present invention. In accordance with the IS-95 standard, the data or voice is partitioned into code channel frames that are 20 milliseconds wide with data rates as high as 14.4 Kbps. Additional examples of a communication systems carrying both voice and data comprise communication systems conforming to the "3rd Generation Partnership Project" (3GPP), embodied in a set of documents including Document Nos. 3G TS 25.211, 3G TS 25.212, 3G TS 25.213, and 3G TS 25.214 (the W-CDMA standard), or "TR-45.5 Physical Layer Standard for cdma2000 Spread Spectrum Systems, Release C" (the IS-2000 standard), also known as the 1xEV-DV proposal.

An example of a data only communication system is a high data rate (HDR) communication system that conforms to the TIA/EIA/IS-856 industry standard, hereinafter referred to as the IS-856 standard. This HDR system is based on a communication system disclosed in U.S. Pat. No. 6,574,211, entitled "METHOD AND APPARATUS FOR HIGH RATE PACKET DATA TRANSMISSION," issued Jun. 3, 2003, and assigned to the assignee of the present invention. The HDR communication system defines a set of data rates, ranging from 38.4 kbps to 2.4 Mbps, at which an access point (AP) may send data to a subscriber station (access terminal, AT). Because the AP is analogous to a base station, the terminology with respect to cells and sectors is the same as with respect to voice systems.

In a multiple-access communication system, communications among users are conducted through one or more base stations. A first user on one subscriber station communicates to a second user on a second subscriber station by transmitting data on a reverse link to a base station. The base station receives the data and can route the data to another base station. The data is transmitted on a forward link of the same base station, or the other base station, to the second subscriber station. The forward link refers to transmission from a base station to a subscriber station and the reverse link refers to transmission from a subscriber station to a base station. Likewise, the communication can be conducted between a first user on one subscriber station and a second user on a landline station. A base station receives the data from the user on a reverse link, and routes the data through a public switched telephone network (PSTN) to the second user. In many communication systems, e.g., IS-95, W-CDMA, IS-2000, the forward link and the reverse link are allocated separate frequencies.

The above described wireless communication service is an example of a point-to-point communication service. In contrast, broadcast or multicast services provide point-to-multipoint communication service. The basic model of a broadcast or multicast system consists of a broadcast or multicast net of users served by one or more central stations, which transmit information with a certain contents, e.g., news, movies, sports events and the like to the users. Each broadcast or multicast net user's subscriber station monitors a common broadcast or multicast forward link signal. Because the central station fixedly determines the content, the users are generally not communicating back. Examples of common usage of broadcast or multicast services communication systems are TV broadcast, radio broadcast, push-to-talk group calls, and the like. Such communication systems are generally highly specialized purpose-build communication systems. With the recent, advancements in wireless cellular telephone systems there has been an interest of utilizing the existing infrastructure of the—mainly point-topoint cellular telephone systems for broadcast or multicast services. (As used herein, the term "cellular" systems encompasses communication systems utilizing both cellular and PCS frequencies.)

The information signal to be exchanged among the terminals in a communication system is often organized into a plurality of packets. For the purposes of this description, a packet is a group of bytes, including data (payload) and control elements, arranged into a specific format. The control elements comprise, e.g., a preamble and a quality metric. The quality metric comprises, e.g., cyclical redundancy check (CRC), parity bit(s), and other types of metric known to one skilled in the art. The packets are usually formatted into a message in accordance with a communication channel structure. The message, appropriately modulated, traveling between the origination terminal and the destination terminal, is affected by characteristics of the communication channel, e.g., signal-to-noise ratio, fading, time variance, and other such characteristics. Such characteristics affect the modulated signal differently in different communication channels. Consequently, transmission of a modulated signal over a wireless communication channel requires different considerations than transmission of a modulated signal over a wire-like communication channel, e.g., a coaxial cable or an optical cable.

In addition to selecting a modulation appropriate for a particular communication channel, other methods for protecting the information signal have been devised. Such methods comprise, e.g., encoding, symbol repetition, interleaving, and other methods known to one of ordinary skill in the art. However, these methods increase overhead. Therefore, an engineering compromise between reliability of message delivery and the amount of overhead must be made. Even with the above-discussed protection of information, the conditions of the communication channel can degrade to the point at which the destination station possibly cannot decode (erases) some of the packets comprising the message. In data-only communications systems, the cure is to re-transmit the non-decoded packets using an Automatic Retransmission reQuest (ARQ) made by the destination station to the origination station. However, as discussed, the subscribers do not communicate back to the base station. Furthermore, even if the subscribers were allowed to communicate ARQ, this communication might overload the communication system. Consequently, other means of information protection are desirable.

SUMMARY

Embodiments disclosed herein address the above stated needs by providing a method and system for code combining data from different base station in a communication system.

BRIEF DESCRIPTION OF THE DRAWINGS

FIG. 2 illustrates a concept of physical and logical channels for the HSBS;

FIG. 3 illustrates a prior art encoding in accordance with an embodiment;

DETAILED DESCRIPTION

Definitions

Figure 1:
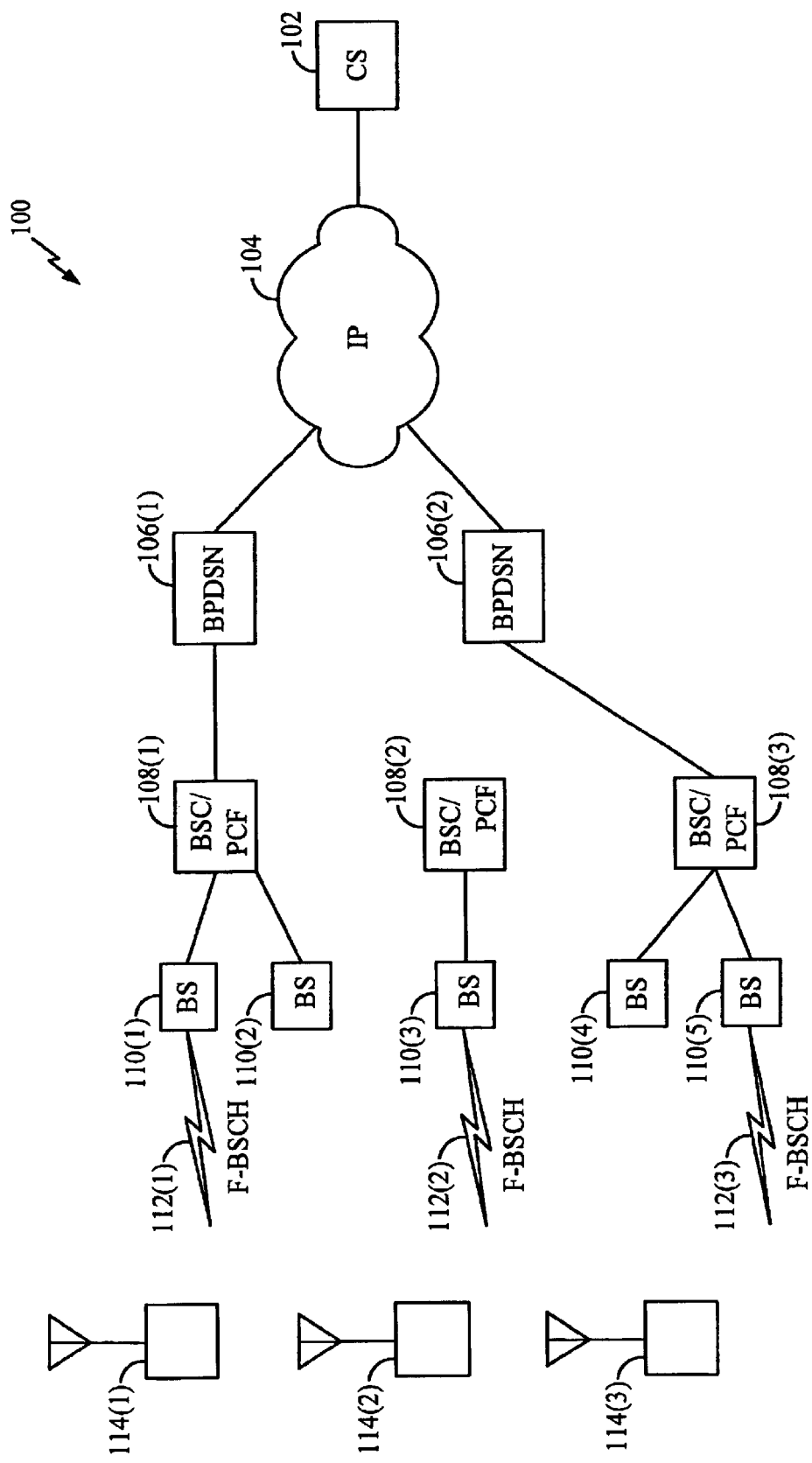
FIG. 1 illustrates conceptual block diagram of a High-Speed Broadcast or multicast or multicast Service (HSBSMS) communication system.

The word "exemplary" is used herein to mean "serving as an example, instance, or illustration." Any embodiment described herein as "exemplary" is not necessarily to be construed as preferred or advantageous over other embodiments.

The terms point-to-point communication is used herein to mean a communication between two subscriber stations over a dedicated communication channel.

The terms broadcast or multicast or multicast communication or point-to-multipoint communication are used herein to mean a communication wherein a plurality of subscriber stations are receiving communication from one source.

The term packet is used herein to mean a group of bits, including data (payload) and control elements, arranged into a specific format. The control elements comprise, e.g., a preamble, a quality metric, and others known to one skilled in the art. Quality metric comprises, e.g., a cyclical redundancy check (CRC), a parity bit, and others known to one skilled in the art.

The term access network is used herein to mean a collection of base stations (BS) and one or more base stations' controllers. The access network transports data packets between multiple subscriber stations. The access network may be further connected to additional networks outside the access network, such as a corporate intranet or the Internet, and may transport data packets between each access terminal and such outside networks.

The term base station is used herein to mean the hardware with which subscriber stations communicate. Cell refers to the hardware or a geographic coverage area, depending on the context in which the term is used. A sector is a partition of a cell. Because a sector has the attributes of a cell, the teachings described in terms of cells are readily extended to sectors.

The term subscriber station is used herein to mean the hardware with which an access network communicates. A subscriber station may be mobile or stationary. A subscriber station may be any data device that communicates through a wireless channel or through a wired channel, for example using fiber optic or coaxial cables. A subscriber station may further be any of a number of types of devices including but not limited to PC card, compact flash, external or internal modem, or wireless or wireline phone. A subscriber station that is in the process of establishing an active traffic channel connection with a base station is said to be in a connection setup state. A subscriber station that has established an active traffic channel connection with a base station is called an active subscriber station, and is said to be in a traffic state.

The term physical channel is used herein to mean a communication route over which a signal propagates described in terms of modulation characteristics and coding.

The term logical channel is used herein to mean a communication route within the protocol layers of either the base station or the subscriber station.

The term communication channel/link is used herein to mean a physical channel or a logical channel in accordance with the context.

The term reverse channel/link is used herein to mean a communication channel/link through which the subscriber station sends signals to the base station.

A forward channel/link is used herein to mean a communication channel/link through which a base station sends signals to a subscriber station.

The term erasure is used herein to mean failure to recognize a message.

The term dedicated channel is used herein to mean a channel modulated by information specific to an individual subscriber station.

The term common channel is used herein to mean a channel modulated by information shared among all subscriber stations.

The term F-PDCH is used herein to represent a forward data packet channel.

The term F-PDCCH is used herein to represent a forward data packet control channel.

The term subset is defined as a set contained within a set.
Description

A basic model of a broadcast or multicast system comprises a broadcast or multicast net of users, served by one or more central stations, which transmit information with a certain contents, e.g., news, movies, sports events and the like to the users. Each broadcast or multicast net user's subscriber station monitors a common broadcast or multicast forward link signal. FIG. 1 illustrates a conceptual block diagram of a communication system 100, capable of performing High-Speed Broadcast or Multicast Service (HSBSMS) in accordance with an embodiment.

The broadcast or multicast content originates at a content server (CS) 102. The content server may be located within the carrier network (not shown) or outside Internet (IP) 104. The content is delivered in a form of packets to a broadcast or multicast packet data-serving node (BPDSN) 106. The term BPSDN is used because although the BPDSN may be physically co-located, or be identical to a regular PDSN (not shown), the BPDSN may be logically different from a regular PDSN. The BPDSN 106 delivers the packets according to the packet's destination to a packet control function (PCF) 108. The PCF is a control entity controlling function of base stations 110 for the HSBS as a base station controller is for regular voice and data services. To illustrate the connection of the high level concept of the HSBS with the physical access network, FIG. 1 shows a PCF physically co-located or even identical, but logically different from a base station controller (BSC). The BSC/PCF 108 provides the packets to base stations 114.

The communication system 100 enables High-Speed Broadcast or Multicast Service (HSBSMS) by introducing a forward broadcast or multicast shared channel (F-BSMSCH) 112 capable of high data rates that can be received by a large number of subscriber stations 114. The term forward broadcast or multicast shared channel is used herein to mean a single forward link physical channel that carries broadcast or multicast traffic. A single F-BSMSCH can carry one or more HSBSMS channels multiplexed in a TDM fashion within the single F-BSMSCH. The term HSBSMS channel is used herein to mean a single logical HSBSMS broadcast or multicast session defined by the session's broadcast or multicast content. Each session is defined by a broadcast or multicast content that may change with time; for example, 7am—News, 8am—Weather, 9am—Movies, etc. FIG. 2 illustrates the discussed concept of physical and logical channels for the HSBS in accordance with an embodiment.

As illustrated in FIG. 2, an HSBS is provided on two F-BSCHs 202, each of which is transmitted on a separate frequency $f_x$, $f_y$. Thus, for example, in the above-mentioned cdma2000 communication system such a physical channel can comprise, e.g., a forward supplemental channel (F-SCH), forward broadcast control channel (F-BCCH), forward common control channel (F-CCCH), other common and dedicated channels and the channel's combination. The use of common and dedicated channels for information broadcast is disclosed in a co-pending U.S. patent application Ser. No. 10/113,098, entitled "METHOD AND APPARATUS FOR CHANNEL MANAGEMENT FOR POINT-TO-MULTIPOINT SERVICES IN A COMMUNICATION SYSTEM", filed Mar. 28, 2002, and assigned to the assignee of the present invention. One of ordinary skill in the art understands that other communication systems utilize channels performing similar function; therefore, the teaching is applicable to other communication systems.

The F-BSMSCHs 202 carry the broadcast or multicast traffic, which may comprise one or more broadcast or multicast sessions. The F-BSCH1 carries two HSMSBS channels 204a, 204b, which are multiplexed onto the F-BSCH1 202a. The F-BSCH2 202b carries one HSBSMS channel 204c. The content of an HSBSMS channel is formatted into packets comprising a payload 206 and a header 208.

One of ordinary skill in the art recognizes that the HSBSMS broadcast or multicast service deployment as illustrated in FIG. 2 is for pedagogical purposes only. Therefore, in a given sector, the HSBSMS broadcast or multicast service can be deployed in several manners in accordance with features supported by an implementation of a particular communication system. The implementation features include, e.g., the number of HSBSMS sessions supported, number of frequency assignments, number of broadcast or multicast physical channels supported, and other implementation features known to one skilled in the art. Thus, for example, more than two frequencies, and F-BSMSCHs may be deployed in a sector. Furthermore, more than two HSBSMS channels may be multiplexed onto one F-BSMSCH. Furthermore, a single HSBSMS channel can be multiplexed onto more than one broadcast or multicast channel within a sector, on different frequencies to serve the subscribers residing in those frequencies.

As discussed, communications systems often transmit information in frames or blocks, which are protected by encoding against adverse conditions affecting a communication channel. Examples of such systems include cdma2000, WCDMA, UMTS systems. As illustrated in FIG. 3, the bit stream of information to be transmitted 302, originating at higher layers, is provided to an encoder 304 on a physical layer. The encoder accepts a block of bits of a length S. This block of S bits typically includes some overhead, e.g., tail bits for the encoder, a cyclic redundancy check (CRC), and other overhead information known to one of ordinary skills in the art. The overhead bits assist the decoder at the receiving side to ascertain success or failure of decoding. The encoder then encodes the S bits with a selected code resulting in an encoded block of length $P=S+R$, where R denotes the number of redundant bits.

One of ordinary skill in the art would understand that although the embodiments are explained in terms of a layering model, this is for pedagogical purposes, and the various illustrative logical blocks, modules, circuits, and algorithm steps described in connection with the physical layer can be implemented as electronic hardware, computer software, or combinations of both. Thus, for example, the encoder 304 may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Figure 4:
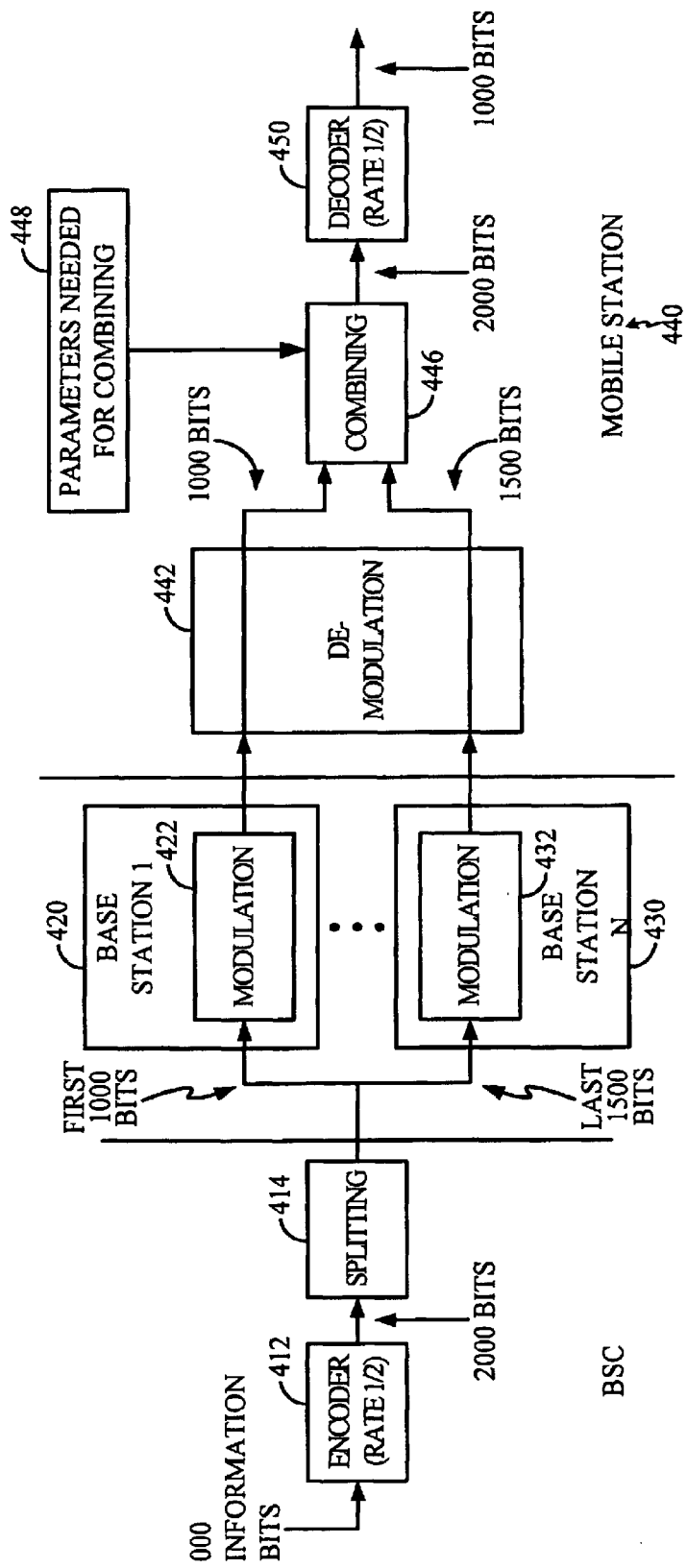
FIG. 4 shows a block diagram illustrating encoding, combining, and decoding of data in accordance with an embodiment.

FIG. 4 shows a block diagram illustrating the encoding, combining, and decoding of data in accordance with an embodiment. Given a 1 k bit stream of information is provided to encoder 412 that is a ½ rate encoder, then 2 k bits are output from the encoder 412. In an embodiment, the encoder is located within a base station controller 410. In another embodiment, the encoder 412 is located within a base station. It would be understood by those skilled in the art that encoders and decoders of varying rates may be used in an embodiment.

In accordance with an embodiment, the 2 k bits are split by a splitter 414 such that a subset of the 2 k bits are sent to each of a plurality of base stations. In an embodiment, the splitter 414 is located within the base station controller 410. It would be understood by those skilled in the art that the splitter 414 could be located separate from the base station controller 410. A subset is defined as a set contained within a set. The subset can contain the same number of members as the set, i.e., the subset can equal the set. A subset can be an empty set. The subsets sent to the plurality of base stations can overlap and can be disjoint.

For pedagogical purposes, only the subset of bits that are sent to the first base station 420 and to a base station N 430 are shown in FIG. 4. It would be understood by those skilled in the art that in a regressive case, there could be only one base station. It would also be understood by those skilled in the art that there could be any number of base stations N where N>1. Serving as an example, the subset comprising the first 1 k bits of the 2 k bits are sent to the first base station 420 and the subset comprising the last 1.5 k bits of the 2 k bits is sent to the second base station N 430.

Each base station 420, 430 includes a modulator 422, 432 that modulates the base station's input signal. After modulation, each base station sends its modulated signals to a mobile station 440. The mobile station 440 includes a demodulator 442 that demodulates the modulated signals from the plurality of base stations.

The outputs of the demodulator 442 are provided to a combiner 446. In an embodiment, the combiner 446 utilizes parameters needed for combining 448 to combine bits from the plurality of base stations. The parameters indicate the position of the bits to be combined relative to their corresponding location in the 2 k bit stream of information originally at the output of the encoder 412. The parameters are sent by the plurality of base stations in signaling from the plurality of base stations to the mobile station 440. It would also be understood by those skilled in the art that the combiner 446 could employ any combining scheme known in the art that increases the reliability of the combined bits.

Figure 5:
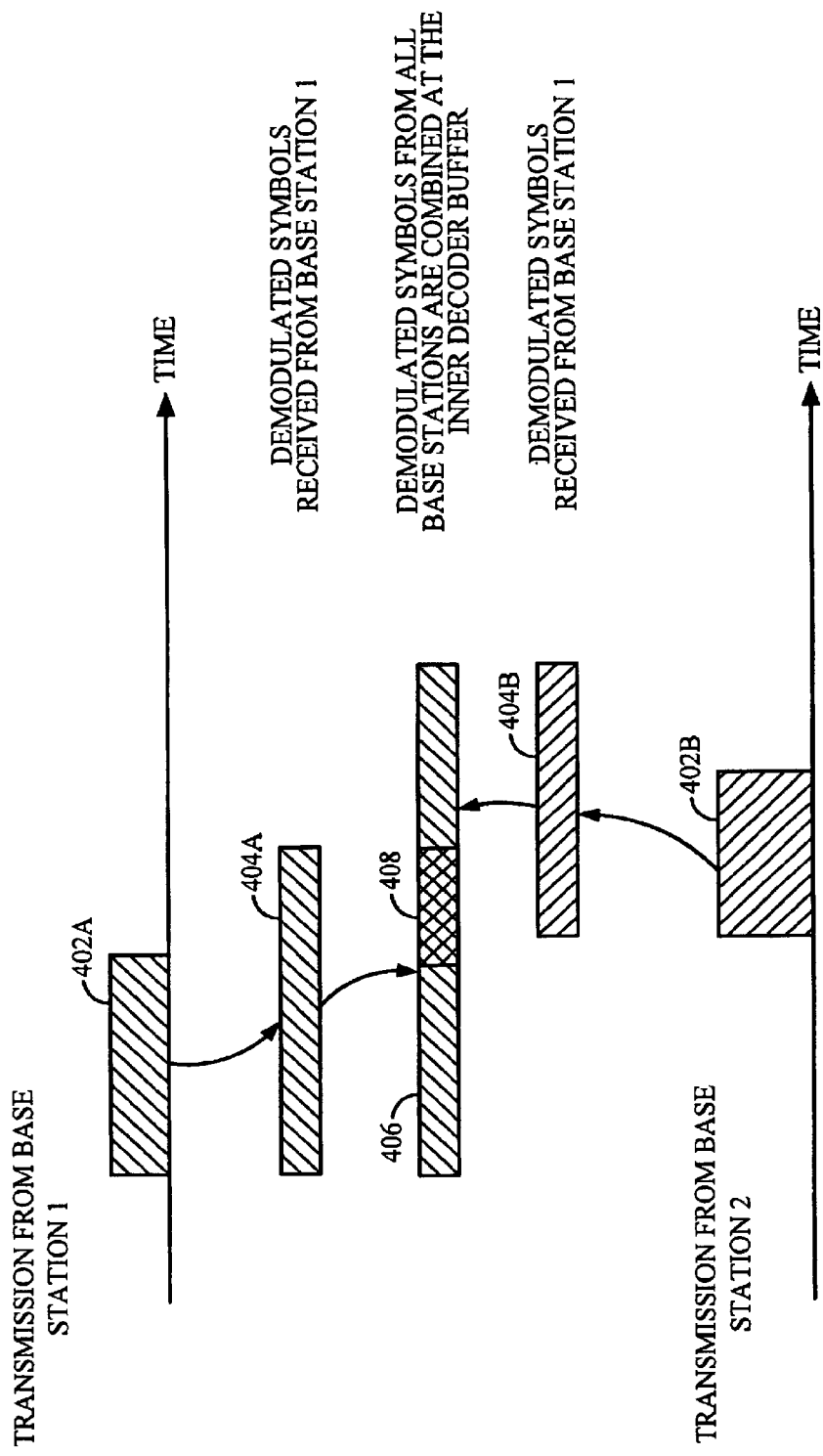
FIG. 5 shows a representation of a combining process of an embodiment as applied to an example.

FIG. 5 shows a representation of the combining process of an embodiment as applied to an example. A first stream of bits 402A is sent from a first base station to a subscriber station and a second stream of bits 402B is sent from a second base station to the subscriber station. The first stream of bits 402A is demodulated and the demodulated stream of bits 404A are provided to the combiner 446. The second stream of bits 404B is demodulated and the demodulated stream of bits 404B are provided to the combiner 446. The combiner 446 combines the demodulated stream of bits 404A, 404B thereby creating a combined stream of bits 406.

The stream of bits denoted by reference number 408 indicates the overlap between the demodulated stream of bits 404A and the demodulated stream of bits 404B.

In reference to the example of FIG. 4, the combined stream of 2 k bits are provided to a decoder 450, which is a ½ rate decoder. The ½ rate decoder 450 decodes the combined stream of 2 k bits and outputs 1 k decoded bits.

The combiner 446 may operate on any level of data. In an embodiment, the combiner 446 may operate at the bit level. In an embodiment, the combiner 446 may operate at a frame level. In an embodiment, the combiner 446 may operate at a symbol level. It would be understood by those skilled in the art that the combiner 446 may operate on any combination of data known in the art.

Figure 6:
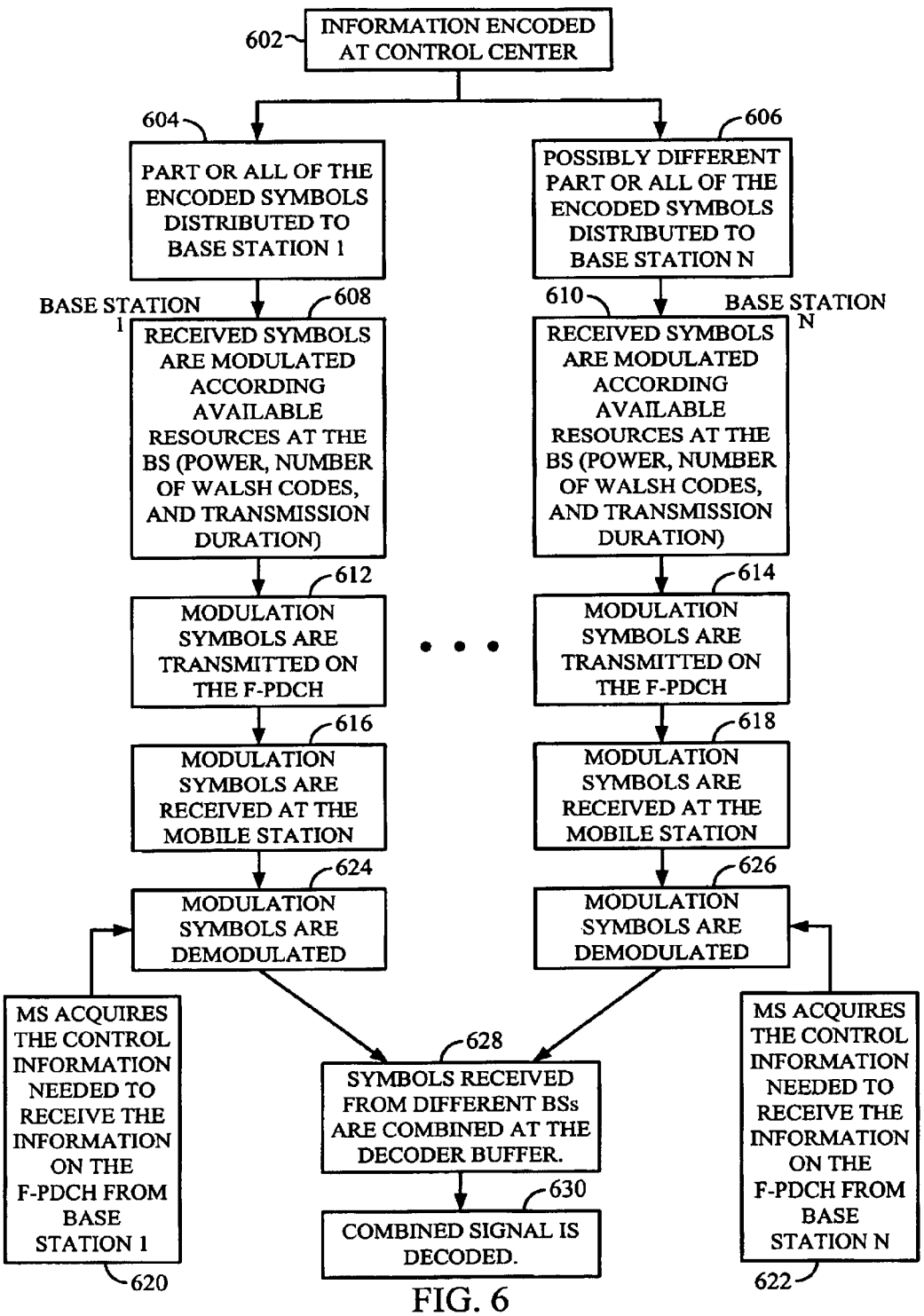
FIG. 6 shows a flowchart of a method for code combining in a communication system in accordance with an embodiment.

FIG. 6 shows a flowchart of a method for code combining in a communication system in an embodiment. In step 602, information is encoded at a control center, and thereby creating encoded symbols. In an embodiment, the control center comprises a base station controller. In an embodiment, the control center comprises a base station.

For pedagogical purposes, the method for code combining is shown with respect to a first base station 420 and a base station N 430. It would be understood by those skilled in the art that in a regressive case, there could be only one base station. It would also be understood by those skilled in the art that there could be any number of base stations N where N>1.

In accordance with an embodiment, a subset of the encoded symbols are distributed to a plurality of base stations. In step 604, a part or all of the encoded symbols are distributed to the first base station 420. Likewise, in step 606, a part or all of the encoded symbols are distributed to the base station N 430, where N is the number of base stations that are distributed encoded symbols.

In step 608, the encoded symbols received at the first base station 420 are modulated according to the available resources at the first base station 420. Likewise, in step 610, the encoded symbols received at the base station N 430 are modulated according to the available resources at the base station N 430. In an embodiment, available resources include power available at a given base station. In an embodiment, available resources include number of Walsh codes available at a given base station. In an embodiment, available resources include transmission duration.

In step 612, the modulated symbols from the first base station 420 (from step 608) are transmitted on the F-PDCH for the first base station 420. Likewise, in step 614, the modulated symbols from base station N 430 (from step 610) are transmitted on the F-PDCH for base station N 430.

In step 616, the modulated symbols from the first base station 420 are received at the mobile station. Like wise in step 618, the modulated symbols from base station N 430 are received at the mobile station.

In step 620, the mobile station 440 acquires control information needed to receive the modulated symbols transmitted on the F-PDCH for the first base station 420. Likewise, in step 622, the mobile station 440 acquires control information needed to receive the modulated symbols transmitted on the F-PDCH for base station N 430.

In step 624, utilizing the control information needed to receive the modulated symbols transmitted on the F-PDCH for the first base station 420, the modulated symbols from the first base station 420 (from step 612) are received at the mobile station 440. Likewise, in step 626, utilizing the control information needed to receive the modulated symbols transmitted on the F-PDCH for base station N 430, the modulated symbols from base station N 430 (from step 614) are received at the mobile station 440.

In step 628, the modulated symbols received from the plurality of base stations are combined resulting in the combined signal, i.e., the combined symbols being located within a decoder buffer.

In step 630, the combined signal is decoded.

In an embodiment, a block of information is encoded at a control center such as a BSC. The encoded symbols are then distributed to multiple base stations. Each base station then can transmit part or all of the encoded symbols.

In an embodiment, a BSC distributes all encoded symbols to each base station. Each base station then decides whether it is going to transmit all or part of the symbols based on its available communication resources (power, Walsh code, time duration), modulates the selected symbols and transmit them. In this case, there is no collaboration among base stations.

In another embodiment, each base station periodically reports its available communication resources (power, Walsh code, time duration) to a BSC. The BSC then decides which base station is to transmit what part of the encoded symbols. The BSC operates to reduce the overlap of portions that are to be transmitted by different base stations and to reduce the occurrence of the same encoded symbols transmitted by multiple base stations. Thus, there is some collaboration among base stations. As a result of the collaboration, the effective code rate can be reduced.

In an embodiment, at the receiver, the subscriber station figures out how to combine the symbols received from different base stations. From the information in the F-PDCCH associated with the F-PDCH, the subscriber station can figure out how many binary symbols were transmitted from each base station. However, additional information is still needed in order to combine the symbols from the different base stations.

In an embodiment, a rule indicating which base stations transmit which symbols is defined apriori. In one embodiment, each base station has a default starting point within a bit stream to transmit symbols and the default starting points are known to the subscriber station. In another embodiment, a first base station always starts from the beginning of the bit stream to transmit symbols, and a second base station always starts from the end of the bit stream and works backward through the bit stream.

In an embodiment, explicit signaling is used. Each base station signals to the subscriber station what symbols are being transmitted from the base station. The signaling can be a specification of the range of the selected symbols. It would be apparent to those skilled in the art that there are other means for signaling to the subscriber station an indication of what-symbols are being transmitted from each base station.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

What is claimed is:

1. A method of combining, comprising:

encoding a set of bits;

distributing a first subset of the encoded bits to a first station;

distributing a second subset of the encoded bits to a second station;

modulating the first subset of bits, the modulating creating a modulated first subset of bits;

modulating the second subset of bits, the modulating creating a modulated second subset of bits;

transmitting the modulated first subset of bits to a third station;

transmitting the modulated second subset of bits to the third station;

demodulating the modulated first subset of bits, the demodulating creating a demodulated first subset of bits;

demodulating the modulated second subset of bits, the demodulating creating a demodulated second subset of bits; combining the demodulated first subset of bits with the demodulated second subset of bits;

determining the first subset of bits and the second subset of bits based on the available communication resources of the first station and the available communication resources of the second station.

2. The method of claim 1, wherein the first station and the second station are base stations.

3. The method of claim 1, wherein the third station is a subscriber station.

4. The method of claim 1, wherein the combining is performed based on an apriori rule indicating the first subset of bits and the second subset of bits.

5. The method of claim 1, wherein the combining is performed based on a signaling from the first station and the second station to the third station, the signaling from the first station indicating the first subset of bits and the signaling from the second station indicating the second subset of bits.

6. The method of claim 1, wherein the first station transmits the modulated first subset of bits to the third station based on a communication resource.

7. The method of claim 6, wherein the communication resource is power.

8. The method of claim 6, wherein the communication resource is a number of Walsh codes available for transmission.

9. The method of claim 6, wherein the communication resource is transmission time availability.

10. The method of claim 1, further comprising reporting available communication resources of the first station and the second station to a fourth station, wherein the fourth station determines the first subset of bits and the second subset of bits.

11. The method of claim 1, wherein the transmitting is on a forward data packet channel.

12. The method of claim 11, wherein the third station determines how many bits were transmitted from the first station based on information on a forward data packet control channel from the first station and determines how many bits were transmitted from the second station based on information on a forward data packet control channel from the second station.

* * * * *